United States Patent [19]

Chen et al.

[11] Patent Number: 5,093,221
[45] Date of Patent: Mar. 3, 1992

[54] PROCESS OF MAKING COLORED IMAGES USING AQUEOUS PROCESSABLE PHOTOSENSITIVE ELEMENTS

[75] Inventors: Gwendyline Y. Y. T. Chen; Floyd A. Raymond, both of Wilmington, Del.; Jeffrey J. Patricia, Vestal, N.Y.; Walter R. Hertler, Kennett Square, Pa.

[73] Assignee: E. I. Du Pont de Nemours and Company, Wilmington, Del.

[21] Appl. No.: 740,611

[22] Filed: Aug. 5, 1991

Related U.S. Application Data

[62] Division of Ser. No. 507,339, Apr. 10, 1990.

[51] Int. Cl.$^5$ .............................................. G03C 11/12
[52] U.S. Cl. ..................... 430/257; 430/260; 430/270; 430/376; 430/326
[58] Field of Search ............... 430/257, 260, 325, 326, 430/270, 271, 306; 522/127, 144

[56] References Cited

U.S. PATENT DOCUMENTS

| | | | |
|---|---|---|---|
| 4,053,313 | 10/1977 | Fan | 96/36 |
| 4,376,158 | 3/1983 | Spechler | 430/291 |
| 4,376,159 | 3/1983 | Spechler | 430/293 |
| 4,678,737 | 7/1987 | Schneller et al. | 430/270 |
| 4,820,607 | 4/1989 | Aoai | 430/190 |
| 4,898,803 | 3/1990 | Aoai et al. | 430/270 |
| 4,916,046 | 4/1990 | Dossel | 430/270 |
| 4,931,376 | 6/1990 | Brunsvole et al. | 430/270 |

FOREIGN PATENT DOCUMENTS 0264908  4/1988  European Pat. Off.

OTHER PUBLICATIONS

Dissertation Abstracts International, vol. 49, No. 9, Mar. 1989, 3791-B.

J. E. Kearns, C. D. McLean, D. H. Solomon, "Polymers and Copolymers of Unsaturated Tetrahydropyranyl Esters", (1974) *J. Macromol. Sci-Chem.* A8(4), pp. 673-685.

*Primary Examiner*—Jack P. Brammer

[57] ABSTRACT

A photosensitive element adapted for the preparation of colored images is disclosed. The photosensitive element comprises: a photosolubilizable layer consisting essentially of an acid-labile polymer and a photosolubilizing agent; an elastomeric layer; and a support. It can be processed by aqueous solvents, preferably ordinary tap water.

10 Claims, No Drawings

PROCESS OF MAKING COLORED IMAGES USING AQUEOUS PROCESSABLE PHOTOSENSITIVE ELEMENTS

This is a division of application Ser. No. 07/507,339, filed Apr. 10, 1990.

FIELD OF THE INVENTION

This invention relates to an aqueous processable photosensitive element for image reproduction. More particularly it relates to a photosensitive element comprising a photosolubilizable layer, an elastomeric layer, and a support.

BACKGROUND OF THE INVENTION

Photosensitive elements for image-reproduction are well-known in the graphics arts industry. Such elements are exposed to actinic radiation through an image-bearing transparency, such as a color separation transparency, to produce a duplicate image that is either a positive or negative of the transparency. Positive-working elements produce a duplicate image of the transparency; that is, the colored regions of the transparency are colored and the uncolored regions in the transparency are uncolored in the final image. Negative-working elements produce an image that is the reverse of the transparency; that is, the colored regions of the transparency are uncolored and the uncolored regions in the transparency are colored in the final image. After imagewise exposure, the photosensitive elements are developed by washout of soluble image areas, toning with a colorant, peeling apart, or combinations of these techniques.

In general, such photosensitive elements offer a limited choice of receptors for the final image. For example, in proofing applications it generally is not possible to form the final image (the "proof") on paper that will be used for the printing run. Thus, the proof may not look exactly the same as the printed copy and considerable experience is required to evaluate the proof.

In addition to limited choices of receptor for the final image, many photosensitive elements for image reproduction have the added disadvantage of requiring washout by an organic solvent. For example, U.S. Pat. No. 4,053,313 (Fan) discloses a photosensitive element comprising a solvent-processable photosensitive layer, a tonable elastomeric layer, and a support, that is processed (i.e., washed-out) by a mixture of water and organic solvent. The elements disclosed in U.S. Pat. Nos. 4,376,158 and 4,376,159 (Speckler) require aqueous base for washout. Use of organic solvents or aqueous bases frequently is undesirable due to flammability, toxicity, corrosion and/or waste disposal considerations.

Thus there continues to be a need for improved photosensitive elements capable of reproducing images on a variety of receptors and that can be processed with aqueous solutions, preferably with ordinary tap water.

SUMMARY OF THE INVENTION

This invention provides a photosensitive element for image reproduction which can be processed (washed-out) with water or dilute base. The photosensitive element may be used to prepare a colored image, such as a multilayer surprint proof, on a variety of desired substrates.

In one embodiment, the invention provides a photosensitive element adapted for the preparation of a colored image, the element comprising:
  (1) a photosolubilizable layer consisting essentially of:
    (a) a photosolubilizing agent and
    (b) an acid-labile polymer having a polymer backbone and pendent acid-labile groups bound to the polymer backbone, said pendent acid-labile groups being represented by the formula:

where:
    $R^1$ is hydrogen or alkyl from about 1 to about 6 carbon atoms;
    $R^2$ is alkyl from 1 to about 8 carbon atoms;
    $R^3$ and $R^4$ are each independently hydrogen or alkyl from 1 to about 6 carbon atoms;
    wherein either $R^1$ and $R^2$; $R^1$ and $R^3$; or $R^2$ and $R^3$ may be joined to form a 5-, 6-, or 7-membered ring;
  (2) an elastomeric layer, and
  (3) a support In another embodiment, the invention provides a process for preparing a colored image comprising:
  (A) providing a multilayer photosensitive element comprising, in order:
    (1) a photosolubilizable layer consisting essentially of:
      (a) a photosolubilizing agent and
      (b) an acid-labile polymer having a polymer backbone and pendent acid-labile groups bound to the polymer backbone, said pendent acid-labile groups being represented by the formula:

where;
      $R^1$ is hydrogen or alkyl from about 1 to about 6 carbon atoms;
      $R^2$ is alkyl from 1 to about 8 carbon atoms;
      $R^3$ and $R^4$ are each independently hydrogen or alkyl from 1 to about 6 carbon atoms;
      wherein either $R^1$ and $R^2$; $R^1$ and $R^3$; or $R^2$ and $R^3$ may be joined to form a 5-, 6-, or 7-membered ring;
    (2) an elastomeric layer, and
    (3) a removable support;
  (B) forming a latent image in said photosensitive element by exposing said photosolubilizable layer to actinic radiation through an image-bearing transparency;
  (C) removing regions of said photosolubilizable layer decomposed in step B by washing with an aqueous solvent, thereby revealing regions of the elastomeric
  (D) producing a colored image by applying colorant material to the surface of said photosensitive element, said colorant material selectively adhering only to revealed regions of the elastomeric layer;
  (E) providing a transfer element comprising a transfer sheet and an elastomeric layer;
  (F) laminating the surface of the photosensitive element bearing the colored image to the elastomeric layer of said transfer element;

(G) removing said removable support of said photosensitive element to reveal the elastomeric layer; and (H) laminating the elastomeric layer of said photosensitive element to a receptor.

The transfer sheet may be removed, or it may be left in place to protect the image. Also, after step D the remaining regions of the photosolubilizable layer may be flooded with actinic radiation and removed by a washout step. In a preferred embodiment, multiple colored images are prepared by steps (A) through (D). After removal of the removable support in step (G), the images are laminated in register to produce an image, having two or more colors, adhered to the transfer sheet. The temporary support is removed from the last colored image, and the last multicolor image is laminated to the receptor. A four color surprint proof may be formed by selecting color transparencies and colorant material corresponding to yellow, magenta, cyan and black.

DETAILED DESCRIPTION OF THE INVENTION

The invention provides a photosensitive element and a process adapted for the preparation of colored images. The photosensitive element has a photosolubilizable layer consisting essentially of an acid-labile polymer and a photosolubilizing agent; an elastomeric layer; and a support.

Acid-Labile Polymer

The acid-labile polymer has a polymer backbone and recurring pendent acid-labile functional groups bound directly or indirectly to the polymer backbone. The acid-labile groups are represented by the following structure:

$-CO_2-C(R^1)(OR^2)-CH(R^3)(R^4)$ where:
$R^1$ is hydrogen or alkyl from about 1 to about 6 carbon atoms;
$R^2$ is alkyl from 1 to about 8 carbon atoms;
$R^3$ and $R^4$ are each independently hydrogen or alkyl from about 1 to about 6 carbon atoms;
wherein either $R^1$ and $R^2$; $R^1$ and $R^3$; or $R^2$ and $R^3$ may be joined to form a 5-, 6-, or 7-membered ring.

This description includes polymers in which $R^1$ and $R^2$, $R^1$ and $R^3$, or $R^2$ and $R^3$ are joined to form a 5-, 6-, or 7-membered ring. For example, when $R^2$ and $R^3$ are $(CH_2)_3$ and joined, a 6-membered, tetrahydropyranyl ring is formed.

The polymer backbone consists of the chain of atoms and/or moieties formed during polymerization. The acid-labile group may be bound directly to the polymer backbone with no intervening atoms, such as in poly(THPMA), a homopolymer of tetrahydropanyl methacrylate, and poly(THPA), a homopolymer of tetrahydropyranyl acrylate. One or more additional atoms may be present between the acid-labile group and the polymer backbone. An example of such indirect bonding is a polystyrene in which the acid-labile groups are attached to a phenyl substituent of the polymerized styrene.

Although other polymers may be used in the practice of this invention, acrylate and methacrylate polymers are preferred. While small amounts of other monomers may be present, the polymer backbone fundamentally has recurring units of one or more acrylate and/or methacrylate monomers. In general, these polymers do not absorb the actinic radiation used to activate the photosolubilizing agent, are readily prepared by conventional synthetic procedures, adhere to the elastomeric layer, are compatible with the photosolubilizing agents, and do not accept toner during toning.

Properties of the acid-labile polymer may be controlled by the choice of monomers and manner of polymerization. The polymer may be either a homopolymer, a random or block copolymer, a terpolymer, or a higher polymer of various acid-labile monomers. The copolymers and higher polymers may also contain conventional non-acid-labile monomers, such as methyl methacrylate, ethyl methacrylate, furfuryl methacrylate, benzyl methacrylate, and styrene. Small amounts (typically less than 5 mol%) of glycidyl methacrylate or similar monomers may be included to promote adhesion. However, monomers having groups that easily hydrolyze or thermally cleave generally will not be included.

For efficient washout by water or aqueous base (such as, 0.4N aqueous sodium hydroxide), it is preferred that the polymer backbone have at least about 50 mol% recurring units of an acid-labile monomer or monomers. An example is 50:50 poly(THPMA/FMA), a copolymer containing 50 mol% of tetrahydropyranyl methacrylate and 50 mol% of furfuryl methacrylate. Polymers consisting essentially of recurring units of an one or more acid-labile acrylate and/or methacrylate monomers are particularly useful. Examples are poly-(EPMA), a homopolymer of 1-(ethoxy)-propyl methacrylate, and 59:41 poly(THPMA/THPA), a copolymer containing 59 mol% tetrahydropyranyl methacrylate and 41 mol% of tetrahydropyranyl acrylate. Preferred acid-labile groups are those wherein (1) $R^1$ is H; $R^2$ is an alkyl group having 1 to about 4 carbon atoms; $R^3$ is hydrogen or $CH_3$; and $R_4$ is H, or (2) $R^1$ is H; $R^2$ and $R^3$ is $(CH_2)_3$; and $R_4$ is H.

More preferred are acid-labile acrylate polymers in which the polymer backbone consists essentially of recurring units of one or more acid-labile acrylate monomers. For acrylate polymers, the preferred acid-labile groups are those wherein (1) $R^1$ is H; $R^2$ is an alkyl group having 1 to about 4 carbon atoms; $R^3$ is hydrogen or $CH_3$; and $R_4$ is H, or (2) $R^1$ is H; $R^2$ and $R^3$ are $(CH_2)_3$; and $R^4$ is H. The most preferred polymer is poly(THPA), a polymer in which $R^1$ is H; $R^2$ and $R^3$ are $(CH_2)_3$; and $R^4$ is H. The polymer backbone of this polymer consists essentially of recurring units of tetrahydropyranyl acrylate. Because this polymer has a low glass transition temperature (Tg), the photosolubilizable layer formed from this polymer will not crack when coated on a flexible support.

Acid-labile polymers may be prepared by (1) polymerization of acid-labile monomers using conventional polymerization techniques or (2) derivatization of a preformed polymer, such as by acid catalyzed reaction of a polymer containing carboxylic acid and/or ester groups with vinyl ethers. Acid-labile monomers may be prepared by conventional synthesis techniques. An example is acid catalyzed reaction of methacrylic acid with an alkyl vinyl ether, such as, ethyl vinyl ether or dihydropyran. These monomers may be polymerized by group transfer polymerization, such as that described in U.S. Pat. No. 4,417,034; free radical polymerization; or other conventional polymerization techniques, such as anionic polymerization.

Group transfer polymerization produces highly reproducible, nearly monodisperse (polydispersity less than 1.75 for the polymerization of methacrylate monomers and somewhat higher for acrylate monomers) materials. Group transfer polymerization is particularly adapted to polymerization of methacrylate and acrylate monomers. The molecular weight of the polymer is dependent on the ratio of monomer to initiator; polydispersity is predominantly dependent on the polymerization conditions. Methods for controlling polydispersity in group transfer polymerization are disclosed in I. B. Dicker et al., Polym. Prepr., Am. Chem. Soc., Div. Polym. Chem., 1987, 28(1), 106.

Photosolubilizing Agent

When activated by actinic radiation, the photosolubilizing agent furnishes acid that catalyzes decomposition of the acid-labile polymer. The agent may do so directly, or may be a system containing a sensitizer that causes the agent to liberate acid when exposed.

Examples of compounds and mixtures that can be used for this purpose are diazonium, phosphonium, sulfonium and iodonium salts; halogen compounds; o-quinone diazide sulfochlorides; organometal/organohalogen combinations; benzoin and o-nitrobenzyl esters of strong acids, e.g. toluene sulfonic acid; and N-hydroxy amide and imide sulfonates disclosed in U.S. Pat. No. 4,371,605. Preferred photosolubilizing agents are diaryliodonium or triarylsulfonium salts, generally salts with complex metal halides ions such as tetrafluoroborate, hexafluoroantimonate, hexafluoroarsenate, and hexafluorophosphate.

It may be desirable to add a sensitizer to the system to adjust the spectral sensitivity to the available wavelength of actinic radiation. The need will depend on the requirements of the system and the specific photosensitive compound used. For example, iodonium and sulfonium salts only respond to wavelengths below 300 nm. These compounds may be sensitized to longer wavelengths using polycyclic aromatic hydrocarbons such as perylene, pyrene, and anthracene, and derivatives thereof. The decomposition of diaryliodonium and triarylsulfonium salts has also been sensitized by bis-(p-N,N-dimethylaminobenzyliden)acetone. For color proofing applications, the use of dye in the photosolubilizing agent, especially a dye whose absorption extends well into the visible region of the spectrum, may be undesirable since such dyes may affect the color of the resulting image.

Anthracene bound sulfonium salts, with chain lengths of three to four atoms, are efficient photosolubilizing agents. These compounds, disclosed in M. G. Tilley, Ph.D. Thesis, North Dakota State University, Fargo, ND (1988) [*Diss. Abstr. Int. B,* 49, 3791 (1989); *Chem. Abstr.,* 111, 39942u], are a preferred class of photosolubilizing agents. The most preferred photosolubilizing agent is ATASS, i.e., sulfonium, [3-(9-anthracenyl)-propyl]diphenyl-, hexafluoroantimonate[-1], a compound wherein the anthracene and sulfonium salt are bonded by a three carbon chain.

The amount of photosolubilizing agent in the photosolubilizable layer should generally be as low as possible without unduly sacrificing sensitivity, and typically is in the range of approximately 0.1% to 5% by weight of the photosolubilizable layer. Less than about 0.1% generally leads to insensitive compositions, while weight percentages greater than about 5% produce compatibility and control problems. For most acid-labile polymers, it is preferred to use approximately 0.5 to 3% by weight photosolubilizing agent in the photosolubilizable layer.

Elastomeric Layer

The elastomeric layer is a tacky or slightly soft, deformable organic material. For an element with good aging stability, suitable materials for the elastomeric layer should restrain diffusion from the photosolubilizable layer into the elastomeric layer. In addition, these materials should be nonmigratory into the photosolubilizable layer. Polymers of butadiene or isoprene; random, teleblock and block copolymers of butadiene and isoprene copolymerized with styrene, and poly(alpha-olefins) in which the alpha-olefin contains from about five to about ten carbon atoms, may be selected to advantage. Poly(alpha-olefins), particularly poly(1-octene), are preferred. It will be apparent that the elastomeric layer must be transparent for applications in which the developed image is viewed through the layer.

Support

The elastomeric layer is present on a support. The support may be any material having the necessary stiffness and dimensional stability, proper adhesion to the elastomeric layer, and resistance to the solvent used for washout, i.e., water or dilute aqueous base. The support is preferably smooth. Exemplary materials useful as supports include: films, such as a polyethylene terephthalate of photographic grade, which may be subbed as described in Alles U.S. Pat. No. 2,779,684; adhesive subbed opaque polyethylene terephthalate film base, such as Melinex ® sold by ICI Americas, Wilmington, DE; and paper stock treated to make it resistant to aqueous solvents. Adhesive subbed opaque polyethylene terephthalate film base is preferred for this application. If the image is to be transferred to another substrate after its formation, a support is selected that will release the elastomeric layer, such as silicon treated polyethylene terephthalate film.

A one-color image may be used directly on the support as an "imposition proof", that is a proof taken to verify that everything is in the right place and properly spaced. Alternatively, the element may be adhered to a transparent receptor element, with the support left in place to prevent blocking or sticking together of stacked images that form an overlay proof. The individual elements, stacked in register, may be used for imposition proofing.

Manufacture

The photosolubilizable layer is prepared by mixing the ingredients in a suitable solvent, such as 2-butanone, usually in the weight ratio of about 10:90 (solids to solvent), coating, and evaporating the solvent. Coating should be uniform. A typical coating weight of about 40 mg/dm$^2$ produces a dry thickness of about 0.004 mm.

Any suitable solvent may be used to coat the elastomeric layer. When the elastomeric layer and photosolubilizable layer are coated simultaneously, the solvents must not cause significant migration of the components between layers. Coatings should be uniform and typically have a thickness of 3 to 15 microns, preferably 7 to 12 microns, when dry. Dry coating weight will be about 30 to 150 mg/dm$^2$, preferably 70 to 120 mg/dm$^2$, although somewhat thinner coatings may be used when the elastomeric layer is a poly(alpha-olefin).

The photosensitive element is prepared using conventional coating techniques. For example, the elastomeric layer may be coated onto the support. After the solvent has evaporated, the photosolubilizable layer is coated over the elastomeric layer. A release film, such as a polyethylene coversheet may be used to protect the photosolubilizable layer until the element is used.

Alternatively, the photosolubilizable layer may coated onto a coversheet. After the solvent has evaporated, a release film, such as polyethylene, optionally may be placed over the coating to protect the photosolubilizable layer until the rest of the element is formed. The elastomeric layer is coated over the photosolubilizable layer. If a release film is present on the photosolubilizable layer, it is stripped off before the elastomeric layer is coated. After the solvent has evaporated, the support is laminated to the surface of the elastomeric layer. The solvent for the elastomeric layer should not solubilize or have a deleterious effect on photosolubilizable layer.

Another method is to coat the photosolubilizable layer onto a coversheet and to coat the elastomeric layer onto the support. The photosolubilizable layer and the elastomeric layer are then laminated together under pressure at room or elevated temperature.

The element may also be prepared using conventional multilayer coating techniques. The photosolubilizable layer and the elastomeric layer may be coated simultaneously onto a coversheet, and the support laminated to the elastomeric layer. Alternatively, the photosolubilizable layer and the elastomeric layer may be coated simultaneously onto the support, and, optionally, a coversheet laminated to the photosolubilizable layer.

Exposure/Image Formation

Any convenient source may be selected to provide actinic radiation absorbed by the photosolubilizing agent. "Actinic radiation" is radiation which is active to produce the acid which catalyzes decomposition of the acid-labile polymer. The radiation can be natural or artificial, monochromatic or polychromatic, incoherent or coherent. Most of the actinic radiation should be absorbed by the photosolubilizing agent for efficient image formation.

Conventional source of actinic radiation include fluorescent, mercury vapor, mercury-xenon, metal additive, and arc lamps. Useful sources of coherent radiation are lasers having emissions that fall within or overlap the absorption bands of the photosolubilizing agent. Exposure is ordinarily carried out through a halftone image-bearing transparency, preferably a halftone color separation transparency. However, other means, such as a modulated scanning laser beam, CRT (cathode ray tube), and the like, are alternative ways of imagewise exposing the elements.

To prepare negative surprint proofs from conventional negative halftone color separation transparencies, the optional coversheet, if present, is removed from an element. Then the element is exposed to actinic radiation through a negative separation transparency. Alternatively, the optional coversheet may be left in place during exposure, and removed following exposure. Exposure is conveniently carried out in a standard vacuum frame to ensure good contact between the transparency and the photosensitive element.

After being allowed to stand a room temperature for several minutes, preferably 2-3 minutes, the exposed element is washed-out with an appropriate solvent. Choice of a washout solvent and conditions will depend on the acid-labile polymer chosen for the photosolubilizable layer. In general, copolymers containing substantial amounts of non-acid-labile monomers will require base, such as 0.4 N sodium hydroxide. Polymers and copolymers consisting essentially of acid-labile monomers may be washed-out in room temperature tap water. Acid-labile polymers consisting essentially of acid-labile acrylate monomers are washed-out more readily using tap water than polymers containing acid-labile methacrylate monomers. The temperature of the washout solvent should not greatly exceed room temperature since deformation of the elastomeric layer may occur at higher temperatures. During washout the exposed element may be gently brushed or rubbed with cotton. Following washout, the exposed and washed-out element may be allowed to air dry or dried with forced air.

The image is developed by applying a suitable colorant material, generally know as a toner. The toner adheres to those portions of the elastomeric layer revealed during washout. After the excess toner is dusted off, the particles will adhere only to the revealed portions of the elastomeric layer. Suitable toners are described in Chu et al., U.S. Pat. No. 3,620,726; Gray, U.S. Pat. No. 3,909,282; Manger et al., U.S. Pat. No. 4,215,193; and Ruskin, U.S. Pat. No. 4,661,439. Toners may be applied by dusting with pads dipped in toners (Burg et al., U.S. Pat. No. 3,060,024); transfer (Burg et al., U.S. Pat. No. 3,060,025); handoperated machine toning (Sandner, U.S. Pat. No. 4,019,821); and automatic toning (Tobias, U.S. Pat. No. 4,069,791).

Since the photosolubilizable layer remains photoactive after washout and toning, the processed element may be overall exposed to actinic radiation and the remaining portions of the photosolubilizable layer washed-out. These optional exposure and washout steps produce a image consisting of support and toned elastomeric layer. These elements may used in the processes described by Speckeler, U.S. Pat. No. 4,376,158.

If the washed-out and toned photosolubilizable layer is not removed, the processed element will have add-on capability. That is the remaining portion of the photosolubilizable layer may be further imagewise exposed, washed-out, and toned to produce a second image. The second image should not overlap any of the areas of the previously formed image.

The processed element may be used without further treatment if a single color surprint proof is desired. The final image will consist of the exposed and washed-out photosolubilizable layer, toned elastomeric layer, and support. A releasable support is not required for this application. However, if transfer to another substrate is desired, a releasable support, such as silicon treated polyethylene terephthalate film, must be used.

The image may be transferred using a transfer element comprising a transfer sheet and an elastomeric layer. In general, the materials which may used as the support may also be used as the transfer sheet. The materials used for the elastomeric layer of the photosensitive element also may be used for the elastomeric layer of the transfer element.

The image may be laminated onto the transfer element to produce an element consisting of: transfer sheet, elastomeric layer, exposed and washed-out photosolubilizable layer (unless it has been removed after the photosensitive element was formed), toned elastomeric layer, and support. If transparent films are used as the transfer sheet and the support, this element may used as an overlay proof.

Alternatively, the support may be removed and the image laminated to a receptor to form a surprint proof. The receptor should be flat and, preferably, smooth. Typical receptors are the various types of paper used in printing. The transfer sheet may be removed, or it may be left in place to protect the final image. If the transfer sheet is to be left in place, a transparent transfer sheet must be used.

If a multicolor surprint image is desired, a second colored image may laminated in register to the back of the toned elastomeric layer of the element consisting of: transfer sheet, elastomeric layer, exposed and washed-out photosolubilizable layer (unless it has been removed after the photosensitive element was formed), and toned elastomeric layer. The image thus formed may be laminated to a receptor to produce a two color image. To form a multicolor image, additional colored images may be laminated in register to this image before final lamination to a the receptor. A four-color surprint proof, consisting of yellow, cyan, magenta, and black images, may be formed in this manner.

The elements and process of this invention are useful for preparing colored images in general. These images are particularly useful in the graphic arts field, especially for color proofing wherein proofs are prepared to duplicate the images produced by printing.

The advantageous properties of this invention can be observed by reference to the following examples which illustrate, but do not limit, the invention.

| GLOSSARY FOR EXAMPLES | |
|---|---|
| ATASS | Anthracene bound triaryl sulfonium salt; Sulfonium, [3-(9-anthracenyl)propyl]diphenyl-, hexafluoroantimonate[1] |
| ADVN | 2,2'-Azobis(2,4-dimethyl)valeronitrile; Vazo ® 52; E. I. Du Pont, Wilmington, DE |
| AIBN | Azobisisobutyronitrile; Vazo ® 64; CAS 78-67-1; Du Pont, Wilmington, DE |
| Cyracure ® UV6974 | Complex triarylsulfonium hexafluoroantimonate; Union Carbide, Danbury, CT |
| Diene 55AC | Polybutadiene; Firestone, Akron, OH |
| EPMA | 1-(Ethoxy)-propyl methacrylate; $CH_2C(CH_3)(CO)OCH(OCH_2CH_3)CH_2CH_3$ |
| Gentro ® 1506/27 | Styrene-butadiene random copolymeric rubber; Gen Corp.; Akron, OH |
| Kraton ® D1107 | Styrene-isoprene-styrene block copolymer; Shell Chemical Corp.; Houston, TX |
| IEMA | 1-(iso-Butoxy)-ethyl methacrylate |
| Melinex ® | Melinex ® 944; filled polyester sheet with a subbed coating; ICI Americas, Wilmington, DE |
| Poly(1-octene) | Ziegler-Natta polymerized 1-octene; MW about 2 million; polydispersity 5.6–6.8 |
| THF | Tetrahydrofuran |
| THPA | Tetrahydropyranyl acrylate |
| THPMA | Tetrahydropyranyl methacrylate |
| TTEB | 1-Trimethylsiloxy-1-(2-trimethylsiloxyethoxy)-2-methyl-1-propene |

EXAMPLE 1

This example illustrates the preparation of a homopolymer of THPA by group transfer polymerization. The preparation of THPA is described in J. E. Kearns, C. D. McLean, and D. H. Solomon, *J. Macromol, Sci.-Chem.*, A8 (4), 673–685, 1974.

During a period of 20 min, 0.8 mL of 0.01M tetrabutylammonium acetate in THF was added dropwise to a solution of 15.6 g (14.6 mL, 100 mmol) of THPA and 0.3 mL (1 mmol) of TTEB in 70 mL of anhydrous THF cooled to 0° C. Exothermic polymerization occurred. The reaction mixture was allowed to warm to room temperature and was quenched with 0.1 mL of methanol. The poly(2-tetrahydropyranyl acrylate) was precipitated in hexane at −70° C. and dried in vacuum at room temperature to yield 11.3 g of polymer. Gel permeation chromatography (GPC): $M_n$ 14,400; $M_w$ 32,700; $M_w/M_n$ 2.26. Differential scanning calorimetry (DSC) shows a $T_g$ at 31.4° C. with a decomposition endotherm at 153.9° C.

EXAMPLE 2

This example illustrates the preparation of a homopolymer of THPA by group transfer polymerization.

During a period of 30 min, 2.0 mL of 0.01M tetrabutylammonium acetate in THF was added dropwise to a solution of 62.4 g (58.4 mL, 400 mmol) of THPA and 1.2 mL (4 mmol) of TTEB in 250 mL of anhydrous THF cooled to −20° C. Exothermic polymerization occurred. The reaction mixture was stirred at less than 0° C. for about 1 hr, allowed to warm to room temperature, and quenched with 0.4 mL of methanol. The poly(2-tetrahydropyranyl acrylate) was precipitated in hexane at −70° C. and dried in vacuum at room temperature. GPC: $M_n$ 19,600; $M_w$ 47,200; $M_w/M_n$ 12.41; DSC: $T_g$ 35° C., with sharp decomposition endotherm at 155° C.

EXAMPLE 3

This example illustrates the preparation of a poly(THPA) with a broad molecular weight distribution by free radical polymerization.

A solution 20 g of THPA and 30 mL of ethyl acetate was heated to reflux and treated with 20 mg of ADVN. After 4 hr, an additional 20 mg of ADVN was added, and heating continued for 2 hr. NMR showed 94% conversion. The poly(2-tetrahydropyranyl acrylate) was isolated by evaporation of the solvent in vacuum. GPC: $M_n$ 27,600; $M_w$ 178,000, $M_w/M_n$ 6.47. DSC: $T_g$ 27° C. with a decomposition endotherm at 148.2° C. (341.9 J/g).

EXAMPLE 4

This example illustrates the preparation of a homopolymer of THPMA by group transfer polymerization. The preparation of THPMA is described in J. E. Kearns, C. D. McLean, and D. H. Solomon, *J. Macromol, Sci.-Chem.*, A8 (4), 673–685, 1974.

To a solution of 0.30 mL (1 mmole) of TTEB and 25 μL of tetrabutylammonium biacetate hexahydrate (0.04M in THF) under argon in 75 mL of THF was added 20 g (19.6 mL, 0.1175 mol) of THPMA, purified as described in Example 1, at a rate such that the temperature did not exceed 40° C. NMR analysis of an aliquot of the solution showed that there was no residual monomer. Precipitation in methanol followed by drying in a vacuum oven at room temperature gave 19.9 g of poly(2-tetrahydropyranyl methacrylate). GPC: $M_n$ 19,300; $M_w$ 21,100; $M_w/M_n$ 1.09. DSC shows a $T_g$ at 91° C. with a sharp decomposition endotherm peaking at 173.6° C.

EXAMPLE 5

This example illustrates the preparation of 1-(ethoxy)-propyl methacrylate (EPMA) and its conversion to a homopolymer by free radical polymerization. In a 1 L round bottom flask fitted with a reflux condenser, addition funnel, thermocouple, and magnetic stirring bar and under an argon atmosphere, a mixture of 120 mL of ethyl 1-propenyl ether, 92.8 mL of methacrylic acid, and 1 gm of phenothiazine was added from the dropping funnel to a solution of 125 mL of ethyl 1-propenyl ether and 12 drops of 50% sulfuric acid during about 30 min. The temperature rose to about 75° C. during the addition. The reaction mixture was cooled to about 50° C., stirred at 50–54° C. for 18 hr, and was then treated with 10 g of sodium bicarbonate and 40 g of anhydrous sodium sulfate. After filtration to remove the solids, the product was distilled three times from calcium hydride, phenothiazine, and diphenylpicrylhydrazyl to give 71.7 g of EPMA, bp 34–38.9° C. (2.1–2.6 mm Hg). Calcd for $C_9H_{16}O_3$: C, 62.77H, 9.36. Found: C, 63.12. H, 9.11. $^1$H NMR (360 MHz, $CDCl_3$): 0.95 (t, J =7.5 Hz, 3H, CH3), 1.22 (t, J =7 Hz, 3H, CH3), 1.76 (m, J =7, 1 Hz, 2H, CH2), 1.96 (m, 3H, =CCH3), 3.57 (m, 1H, OCH2), 3.74 (m, 1H, OCH2), 5.60 (m, 1H, =CH2), 5.84 (t, J =6 Hz, 1H, OCHO, 6.16 (m, 1H, =CH2).

Ethyl acetate (40 mL) was degassed with nitrogen in a round bottom flask. Then 10.1 g (10.9 mL, 59 mmol) of EPMA was added. After the solution had been heated to 75° C. under nitrogen, 75 mg of AIBN was added. After 6 hr at 75° C. an additional 75 mg of AIBN was added, and heating at 75° C. continued for an additional 18 hr. Precipitation with methanol gave the product as an oil which was dried in vacuum to yield 3.85 g of poly(EPMA). Anal: Calcd for $(C_9H_{16}O_3)_n$: C, 62.77; H, 9.36. Found: C, 63.15; H 9.50. IR (film): 1735 cm$^{-1}$ (ester C=O). GPC: $M_n$ 26,600; $M_w$ 34,500; $M_w/M_n$ 1.3. DSC: $T_g$ 48° C., with sharp decomposition endotherm at 193° C. (198 J/9).

EXAMPLE 6

This example illustrates the preparation IEMA and its conversion to a homopolymer by free radical polymerization.

A stirred mixture of 300.5 g (391 mL, 3 moles) of iso-butyl vinyl ether, 129.1 g (127 mL, 1.5 moles) purified methacrylic acid, and 5 g of crosslinked poly(vinylpyridine hydrochloride) (Fluka, Ronkonkoma, NY) catalyst was heated at 65° C. for 18 hr. After the reaction mixture was cooled to room temperature, the catalyst was removed by filtration. The filtrate was stirred for 1 hr with 20 g of anhydrous sodium carbonate and 5 g of calcium hydride, filtered, and the excess isobutyl vinyl ether removed with a rotary evaporator. The product was distilled from calcium hydride, phenothiazine, and diphenylpicrylhydrazyl to give 34.6 g of IEMA, bp 48.5° C. (2.2 mm Hg). Calcd for $C_{10}H_{18}O_3$: C, 64.49; H, 9.74. Found: C., 65.34; H, 9.69. $^1$H NMR (360 MHz, $CDCl_3$): 0.90 (d, J =6 Hz, 3H, CH3), 0.91 (d, J =6 Hz, 3H, CH3), 1.44 (d, J =5 Hz, 3H, CH3), 1.84 (m, 1H, CH), 1.95 (t, J =1 Hz, 3H, CH3C=C), 3.26 (dd, J =7, 10 Hz, 1H, OCH2), 3.44 (dd, J =7, 10 Hz,1H, OCH2), 5.59 (m, 1H, C=CH2), 5.96 (q, J =5 Hz, 1H, OCHO), 6.15 (m, 1H, C=CH2).

A solution of 37 g (200 mmol) of IEMA, 0.1 g of AIBN in 50 mL of ethyl acetate was degassed under nitrogen and heated at 75° C. for 18 hr. Precipitation in methanol at −70° C. followed by drying in vacuum gave 34.6 g of poly(IEMA). Anal: Calcd for $(C_{10}H_{18}O_3)_n$: C, 64.49; H, 9.74. Found: C, 66.06; H, 9.84. GPC: $M_n$ 25,200; $M_w$ 71,500; $M_w/M_n$ 2.83. DSC: $T_g$ 30.2° C. with a decomposition endotherm at 210.2° C. (347 J/g).

EXAMPLE 7

This example illustrates the preparation of a 40:60 (mol%) copolymer of THPMA and EPMA by free radical polymerization.

A mixture of 21.8 mL (118 mmol) of EPMA and 13 mL (78.7 mmol) of THPMA, and 150 mg of AIBN in 80 mL of ethyl acetate was degassed under nitrogen and heated at 75° C. After 3 hr of heating and again after 18 hr of heating additional 150 mg portions of AIBN were added. After an additional 18 hr of heating the polymer was precipitated in methanol at −70° C. to give 27.2 g of copolymer. NMR analysis showed the copolymer to be 40 mol% THPMA and 60 mol% EPMA. GPC: $M_n$ 25,000; $M_w$ 60,900; $M_w/M_n$ 2.42. DSC: $T_g$ 71° C. with a decomposition endotherm at 181° C.

EXAMPLE 8

This example illustrates the preparation of a (61:39 mol%) block copolymer of THPMA and ethyl acrylate by group transfer polymerization.

To a solution of 0.89 mL (3 mmol) of TTEB and 100 μL of tetrabutylammonium biacetate (0.04 M in THF) in 140 mL of anhydrous THF under argon was added 44.17 g (43.3 mL, 259 mmol) of THPMA at a rate to maintain the reaction temperature between 35 and 40° C. When all of the monomer had been added, the reaction flask was promptly cooled to 0° C., and 25 g (27 mL, 250 mmol) of ethyl acrylate containing 50 μL of tetrabutyl-ammonium biacetate (0.04M in THF) was added rapidly. Then 200 μL of tetrabutylammonium biacetate (0.04M in THF) was added dropwise until no further exothermic reaction was observed. The reaction was quenched with 2 mL of methanol. After 10 min, the product was precipitated on methanol containing 10% water to give, after drying, 31.75 g of poly(THPMA-b-ethyl acrylate). NMR showed the polymer to be 39 mol% ethyl acrylate and 61 mol% THPMA. GPC: $M_n$ 21,600; $M_w$ 29,100; $M_w/M_n$ 1.34. DSC: $T_g$ −16° C. with a decomposition endotherm at 168° C.

EXAMPLE 9

This example illustrates the preparation of a (59:41 mol%) copolymer of THPMA and THPA by free radical polymerization.

A mixture of 16.6 mL (17 g, 100 mmol) of THPMA and 15.6 g (100 mmol) of THPA was added dropwise over 4.5 hr to 40 mL of ethyl acetate at reflux. Simultaneously, a solution of 30 mg of ADVN in 6 ml of ethyl acetate was added over 6 hr. During this time the solution became quite viscous. NMR analysis of the reaction mixture showed about 27% of residual acrylate monomer The polymer was precipitated in methanol at −78° C. in a blender to give, after drying at 0.1 mm for 24 hr, 24 g of poly(THPMA/THPA). NMR showed the polymer to be 59 mol% THPMA and 41 mol% THPA. GPC: $M_n$ 58,900; $M_w$ 126,100; $M_w/M_n$ 2.15. DSC: $T_g$ 74° C. with a decomposition endotherm at 160° C.

EXAMPLE 10

This example illustrates the preparation of a 1:1 copolymer of THPMA and furfuryl methacrylate by group transfer polymerization.

THPMA and furfuryl methacrylate were separately purified by passage over columns of basic alumina under argon. Following the procedure of example 4, to a solution of 0.74 mL (2.3 mmol) of TTEB and 0.15 mL of tetrabutylammonium biacetate (0.04M in THF) in 75 mL of THF was added dropwise a mixture of 24 mL (24.6 g, 0.1445 mol) of THPMA and 22.2 mL (24 g, 0.1445 mol) of furfuryl methacrylate. NMR analysis of the reaction mixture showed residual monomers to be present.

The product was precipitated in methanol and dried at 0.1 mm to give 24.4 g of poly(THPMA/furfuryl methacrylate). NMR showed the polymer to be 1:1 (molar ratio) polymer of THPMA and furfuryl methacrylate. GPC: $M_n$ 13,800; $M_w$ 18,000; $M_w/M_n$ 1.3. DSC: $T_g$ 96° C. with a decomposition endotherm at 184° C.

EXAMPLE 11

This example illustrates the preparation of a photosensitive element of this invention and the formation of a colored image therefrom.

Step 1. Elastomeric Layer A solution of poly(1-octene) (1.5%) dissolved in toluene was coated onto a Melinex ® support using a doctor knife with a 3 mil (75 micron) gap. The coating was allowed to air dry to produce an element consisting of: support and poly(1-octene) elastomeric layer.

Step 2. Photosensitive Element A solution of the homopolymer of THPA prepared in Example 1 (10% in the coating solution) and ATASS (0.25% in the coating solution; about 2.5% in the dry coating) in 2-butanone was coated onto the elastomeric layer using a doctor knife with a 1 mil (25 micron) gap. The coating was allowed to air dry to produce a photosensitive element consisting of: support; elastomeric layer; and photosolubilizable layer.

Step 3. Exposure A USRA target (Graphic Arts Technical Foundation, Pittsburgh, PA) was placed on top of the element formed in Step 2 with the emulsion side in contact with the photosolubilizable layer. The element and target were placed in a vacuum frame and a vacuum drawn. The element was exposed for 5 sec to the output a Violux 5002 S lamp mounted in a Douthitt DCOP-X (Douthitt Corp., Detroit, MI) exposure unit.

Step 4. Image Formation The exposed element was allowed to stand at room temperature for about 2-3 min. Then it was washed-out with room temperature tap water. During washout the photosolubilizable layer was gently rubbed with cotton. Then it was dried with and air gun and toned with a Du Pont negative Cromalin ® toner. Image quality as a function of washout time is given in the following table.

| Washout Time (sec) | Image Quality (Dots Held) |
|---|---|
| 10 | 0.5-99.5% |
| 20 | 0.5-98% |
| 40 | 0.5-99.5% |
| 60 | 0.5-99% |
| 300 | 0.5-99% |

Longer exposure times (up to 20 sec) produced images which were inferior to those described above.

EXAMPLE 12

The procedure of Example 11 was repeated with the exception that the concentration of ATASS in the coating solution for the photosolubilizable layer was 0.063% instead of 0.25%. Exposure time was 10 sec. Image quality as a function of washout time is given in the following table.

| Washout Time (sec) | Image Quality (Dots Held) |
|---|---|
| 20 | 10-99.5% |
| 40 | 4-99.5% |
| 60 | 3-99.5% |
| 300 | 1-99.5% |

EXAMPLE 13

The procedure of Example 11 was repeated with the exception that the concentration of ATASS in coating solution for the photosolubilizable layer was 0.063% instead of 0.25% and that the photosensitive layer was coated onto the elastomeric layer using a doctor knife with a 3 mil (76 micron) gap. Exposure time was 20 sec. Image quality as a function of washout time is given in the following table.

| Washout Time (sec) | Image Quality (Dots Held) |
|---|---|
| 10 | 0.5-98% |
| 20 | 0.5-97% |
| 40 | 0.5-98% |
| 60 | 0.5-98% |
| 300 | 0.5-98% |

EXAMPLE 14

The procedure of Example 11 was repeated with the exception that the concentration of ATASS in coating solution for the photosolubilizable layer was 0.125% instead of 0.25% and that the homopolymer of THPA described in Example 2 was used in the photosolubilizable layer in place of the polymer described in Example 1. Exposure time was 5 sec. Image quality as a function of washout time is given in the following table.

| Washout Time (sec) | Image Quality (Dots Held) |
|---|---|
| 40 | 3-99.5% |
| 60 | 3-98% |
| 300 | 0.5-99% |

EXAMPLE 15

The procedure of Example 11 was repeated with the exception that the photosolubilizing agent consisted of Cyracure ® UV6974 (1.0% in the coating solution for the photosolubilizable layer) and 9-anthracenemethyl butyrate (0.5% in the coating solution) and that the homopolymer of THPA described in Example 2 was used in the photosolubilizable layer in place of the polymer described in Example 1. Wash out time was 20 sec. Image quality as a function of exposure time is given in the following table.

| Exposure Time (sec) | Image Quality (Dots Held) |
|---|---|
| 7.5 | 2-99.5% |
| 15 | 0.5-99% |
| 20 | 0.5-98% |
| 22.5 | 0.5-98% |
| 30 | 0.5-98% |

EXAMPLE 16

Following the general procedure of Example 11 a photosensitive element was prepared and imaged. The photosolubilizable layer contained the homopolymer of THPA prepared in Example 3 (about 95%) and ATASS (about 5%). The elastomeric layer was prepared by coating a solution prepared by mixing 10 gm of a 3% solution of a Krayton ®; D1107 in dichloromethane, 10 gm of a 3% solution of Diene 55AC in dichloromethane, 0.10 gm of poly(methyl 2-methylpentadienoate), 0.05 gm of 3M 2-ply tape (3M, St. Paul, MN), and 10 gm of dichloromethane using a a doctor knife with 3 mil gap. Exposure for 3.5 sec, washout for 25 sec in 0.4N sodium hydroxide, and toning gave an image with 1–98% dots.

EXAMPLE 17

Following the general procedure of Example 11 a photosensitive element was prepared and imaged. The photosolubilizable layer was coated directly onto the elastomeric layer from a solution containing 10% of the homopolymer of THPMA described in Example 10, 1% of Cyracure ® UV6974, 0.4% of benzophenone, and 0.1% of 2-chlorothioxanthen-9-one in 2-butanone. The elastomeric layer was a mixture Gentro ® 1506 (about 22%) and Diene 55AC (about 78%). Exposure for 480 sec, washout for 180 sec in 0.4N sodium hydroxide, and toning gave an image with 0.5–99.5% dots.

EXAMPLE 18

Following the general procedure of Example 11 a photosensitive element was prepared and imaged. The photosolubilizable layer was coated directly onto the elastomeric layer from a solution containing 10% of poly(EPMA) described in Example 5, 1% of Cyracure ® UV6974, 0.4% of benzophenone, and 0.1% of 2-chlorothioxanthen-9-one in 2-butanone. The elastomeric layer was a mixture Gentro ® 1506 (about 22%) and Diene 55AC (about 78%). Exposure for 360 sec, washout for 180 sec in 0.4N sodium hydroxide, and toning gave an image with 0.5–99.5% dots.

EXAMPLE 19

Following the general procedure of Example 11 a photosensitive element was prepared and imaged. The photosolubilizable layer was coated directly onto the elastomeric layer from a solution containing 10% of poly(EPMA) described in Example 5, 1% of Cyracu-ATASS dissolved in 2-butanone (89%) and propylene carbonate (0.5%). The elastomeric layer was poly(1-octene). Exposure for 10 sec, washout for about 30 sec in room temperature 0.4N sodium hydroxide, and toning gave an image with 20–98% dots.

EXAMPLE 20

Following the general procedure of Example 11 a photosensitive element was prepared and imaged. The photosolubilizable layer was coated directly onto the elastomeric layer from a solution containing 10% of the copolymer of THPMA and EPMA described in Example 7 and 0.5% of ATASS dissolved in 2-butanone (89%) and propylene carbonate (0.5%). The elastomeric layer was the same as used in Example 16. Exposure for 10 sec, washout for about 120 sec in hot tap water, and toning gave an image with 0.5–98% dots.

EXAMPLE 21

Following the general procedure of Example 11 a photosensitive element was prepared and imaged. The elastomeric layer was coated onto Melinex ® from a solution containing 3% Gentro ® 1506 in dichloromethane using a coating knife with a three mil gap. The photosolubilizable layer was coated directly onto the elastomeric layer from a solution containing 10% of the block copolymer of THPMA and ethyl acrylate described in Example 8, 1% of Cyracure ® UV6974, 0.4% of benzophenone, and 0.1% of 2-chlorothioxanthen-9-one in 2-butanone. Exposure time was 120 sec. The image was washed-out with room temperature 0.4N sodium hydroxide. Washout time was about 180 sec. After toning, an image with 0.5% to 98% dots was obtained.

EXAMPLE 22

Following the general procedure of Example 11 a photosensitive element was prepared and imaged. The photosolubilizable layer was coated directly onto the elastomeric layer from a solution containing 10% of the copolymer of THPMA and THPA described in Example 9 and 0.5% of ATASS dissolved in 2-butanone. The elastomeric layer was poly(1-octene). Exposure for 40 sec, washout for about 60 sec in tap water at 25° C., and toning gave an image with 0.5–80% dots.

EXAMPLE 23

Following the general procedure of Example 11 a photosensitive element was prepared and imaged. The photosolubilizable layer was coated directly onto the elastomeric layer from a solution containing 10% of the copolymer of THPMA and furfuryl methacrylate described in Example 10, 1% of Cyracure ® UV6974, 0.4% of benzophenone, and 0.1% of 2-chlorothioxanthen-9-one in 2-butanone. The elastomeric layer was a mixture Gentro ® 1506 (about 22%) and Diene 55AC (about 78%). Exposure for 480 sec, washout for 180 sec in 0.4N sodium hydroxide, and toning gave an image with 0.5–99.5% dots.

EXAMPLE 24

This example illustrates the preparation of a four color proof using a photosensitive element of this invention.

Step 1. Elastomeric Layer A solution of poly(1-octene) (2.0%) and Diene 55AC (1.0%) dissolved in toluene was coated onto a silicone treated polyethylene terephthalate support using a doctor knife with a 3 mil (75 micron) gap. The coating was allowed to air dry to produce an element consisting of: polyethylene terephthalate support and elastomeric layer.

Step 2. Photosensitive Element A solution of the homopolymer of THPA prepared in Example 2 (10%) and ATASS (0.126%) in 2-butanone was coated onto the elastomeric layer of the element formed in step 1 using a doctor knife with a 1 mil (25 micron) gap. The coating was allowed to air dry to produce a photosensitive element consisting of: polyethylene terephthalate support; elastomeric layer; and photosolubilizable layer.

Step 3. Exposure A yellow Du Pont Cromalin ® proofing system color target (E. I. Du Pont, Wilmington, DE) was placed on top of the element formed in Step 2 with the emulsion side in contact with the photosolubilizable layer and the element and target exposed as described in Step 3 of Example 11.

Step 4. Washout and Toning The exposed sample was allowed to stand at room temperature for about 2-3 min. Then it was washed-out with room temperature tap water for 20 sec, dried, and toned with yellow toner as described in Step 4 of Example 11 to produce a yellow toned image consisting of: exposed and washed-out photosolubilizable layer; toned elastomeric layer; and support.

Step 5. Additional Colored Images The procedure of Steps 3 and 4 was repeated using the photosensitive element produced in Step 2 with cyan, magenta, and black Du Pont Cromalin ® proofing system color targets and, respectively, cyan, magenta, and black toners, to produce cyan, magenta, and black toned images, each consisting of: exposed and washed-out photosolubilizable layer; toned elastomeric layer; and support.

Step 6. Transfer Element The coating solution for the elastomeric layer was coated onto polyethylene terephthalate film as described in Step 1 to produce a transfer element consisting of: polyethylene terephthalate transfer sheet and elastomeric layer.

Step 7. Four Color Image The black toned image prepared in Step 5 was laminated at room temperature onto the elastomeric layer of the transfer element produced in Step 6 to produce a one color black image consisting of: transfer sheet; elastomeric layer; exposed and washed-out photosolubilizable layer; black toned elastomeric layer; and support.

The support was removed from the one color black image formed above and the cyan image produced in Step 6 was laminated in register to the elastomeric layer of the resulting element to produce a two color image consisting of: transfer sheet; elastomeric layer; exposed and washed-out photosolubilizable layer; black toned elastomeric layer; exposed and washed-out photosolubilizable layer; black toned elastomeric layer; and support.

The support was removed from the two color image formed above and the magenta image produced in Step 6 was laminated in register to the elastomeric layer of the resulting element to produce a three color image consisting of: transfer sheet; elastomeric layer; exposed and washed-out photosolubilizable layer; black toned elastomeric layer; exposed and washed-out photosolubilizable layer; cyan toned elastomeric layer; exposed and washed-out photosolubilizable layer; magenta toned elastomeric layer; and support.

The support was removed from the three color image formed above and the yellow image produced in Step 5 was laminated in register to the elastomeric layer of the image thus formed to produce a four color image consisting of: transfer sheet; elastomeric layer; exposed and washed-out photosolubilizable layer; black toned elastomeric layer; exposed and washed-out photosolubilizable layer; cyan toned elastomeric layer; exposed and washed-out photosolubilizable layer; magenta toned elastomeric layer; exposed and washed-out photosolubilizable layer; yellow toned elastomeric layer; and support.

The support was removed from the four color image produced above and the image laminated to a Melinex ® receptor. The transfer sheet was left in place to protect the image. By this process it was also possible to produce four color images mounted on Kromcoat ® paper and on ordinary copier paper.

As many differing embodiments of this invention may be made without departing from the spirit and scope thereof, it is to be understood that this invention is not limited to the specific embodiments except as defined in the appended claims.

Having described the invention, we now claim the following and their equivalents.

What is claimed is:

1. A process for preparing a colored image comprising:
   (A) providing a multilayer photosensitive element comprising, in order:
      (1) a photosolubilizable layer consisting essentially of:
         (a) a photosolubilizing agent and
         (b) an acid-labile polymer having a polymer backbone and pendent acid-labile groups bound to the polymer backbone, said pendent acid-labile groups being represented by the formula:

$$-CO_2-C(R^1)(OR^2)-CH(R^3)(R^4)$$

where:
R$^1$ is hydrogen or alkyl from about 1 to about 6 carbon atoms;
R$^2$ is alkyl from 1 to about 8 carbon atoms;
R$^3$ and R$^4$ are each independently hydrogen or alkyl from 1 to about 6 carbon atoms;
wherein either R$^1$ and R$^2$; R$^1$ and R$^3$; or R$^2$ and R$^3$ may be joined to form a 5-, 6-, or 7-membered ring;
      (2) an elastomeric layer; and
      (3) a removable support;
   (B) forming a latent image in said photosensitive element by exposing said photosolubilizable layer to actinic radiation through an image-bearing transparency;
   (C) removing regions of said photosolubilizable layer decomposed in step B by washing with an aqueous solvent, thereby revealing regions of the elastomeric layer;
   (D) producing a colored image by applying colorant material to the surface of said photosensitive element, said colorant material selectively adhering only to revealed regions of the elastomeric layer;
   (E) providing a transfer element comprising a transfer sheet and an elastomeric layer;
   (F) laminating the surface of the photosensitive element bearing the colored image to the elastomeric layer of said transfer element;
   (G) removing said removable support of said photosensitive element to reveal the elastomeric layer; and
   (H) laminating the elastomeric layer of said photosensitive element to a receptor.

2. The process of claim 1 including the steps, between steps D and E, of exposing said element overall to actinic radiation, and removing the remainder of said photosolubilizable layer with an aqueous solvent.

3. The process of claim 1 wherein said polymer comprises at least about 50 mol% of recurring units of at least one acid-labile monomer.

4. The process of claim 1 wherein said polymer consists essentially of recurring units of one or more acid-labile monomers.

5. The process of claim 1 wherein said polymer consists essentially of recurring units of one or more acrylate, and/or methacrylate monomers.

6. The process of claim 1 wherein the monomer is an acrylate monomer wherein said acid-labile group has the following substituents: $R^1$ and $R^4$ are hydrogen; $R^2$ is an alkyl group having 1 to 4 carbon atoms; and $R^3$ is hydrogen or $CH_3$.

7. The process of claim 1 wherein said polymer selected from the group consisting of poly(tetrahydropyranyl acrylate), poly[1-(ethoxy)propyl methacrylate], and copolymers of tetrahydropyranyl methacrylate and tetrahydropyranyl acrylate.

8. The process of claim 1 wherein said aqueous solvent is water.

9. The process of claim 1 or 2 wherein steps A through D are repeated to produce at least two photosensitive elements bearing colored images, and the photosensitive elements are laminated in registry.

10. The process of claim 9 wherein four photosensitive elements are laminated in registry to produce a four color surprint proof.

* * * * *